United States Patent [19]

Girgis

[11] Patent Number: 4,795,678

[45] Date of Patent: Jan. 3, 1989

[54] CHEMICALLY TREATED GLASS FIBERS

[75] Inventor: Mikhail M. Girgis, Pittsburgh, Pa.

[73] Assignee: PPG Industries, Inc., Pittsburgh, Pa.

[21] Appl. No.: 170,588

[22] Filed: Mar. 14, 1988

Related U.S. Application Data

[63] Continuation of Ser. No. 750,959, Jul. 2, 1985, abandoned.

[51] Int. Cl.$^4$ .................... B32B 9/00; B32B 25/20; D02G 3/00
[52] U.S. Cl. .................... 428/391; 428/375; 428/378; 428/392
[58] Field of Search ............... 428/375, 378, 391, 392, 428/394

[56] References Cited

U.S. PATENT DOCUMENTS

| | | | |
|---|---|---|---|
| 3,249,411 | 5/1966 | McWilliams et al. ............ | 65/3 |
| 3,414,432 | 12/1968 | Mertzweiller et al. ............ | 117/126 |
| 3,787,224 | 1/1974 | Uffner ........................... | 117/72 |
| 3,827,230 | 8/1974 | Marzocchi et al. ............. | 57/140 G |
| 3,837,898 | 9/1974 | McCombs et al. .............. | 117/72 |
| 3,853,605 | 12/1974 | Fahey ............................ | 117/126 GB |
| 3,936,415 | 2/1976 | Coakley ......................... | 260/42.15 |
| 4,147,833 | 4/1979 | Eilerman et al. ............... | 428/378 |
| 4,271,229 | 6/1981 | Temple .......................... | 428/391 |
| 4,289,672 | 9/1981 | Friederich et al. ............. | 260/29.2 TN |
| 4,296,173 | 10/1981 | Fahey ............................ | 428/378 |
| 4,318,960 | 3/1982 | McCombs et al. .............. | 428/378 |
| 4,390,647 | 6/1983 | Girgis ............................ | 523/212 |
| 4,394,418 | 7/1983 | Temple .......................... | 428/391 |
| 4,397,913 | 8/1983 | Fahey ............................ | 428/391 |
| 4,457,970 | 7/1984 | Das et al. ....................... | 428/391 |
| 4,470,252 | 9/1984 | Brodmann ...................... | 428/375 |
| 4,489,131 | 12/1984 | Black et al. .................... | 428/375 |
| 4,536,446 | 8/1985 | Hsu et al. ....................... | 428/375 |

*Primary Examiner*—Sharon A. Gibson
*Attorney, Agent, or Firm*—Kenneth J. Stachel

[57] ABSTRACT

Chemically treated glass fiber strands can have a reduced tendency for fiber breakage and fuzz ball production through the present invention. The present invention constitutes glass fiber strands where the glass fibers have a moisture-reduced, non-homogeneous residue having a lubricious phase, where the residue results from an aqueous chemical treating composition having: a lubricating system; an aqueous soluble, dispersible or emulsifiable film forming polymer that produces a non-rigid film; and water. The lubricating system has one or more polyoxyalkylene polyols and/or polyalkylene polyols with an effective high molecular weight in an effective amount of the solids of the aqueous chemical treating composition to form a lubricious phase and a cationic lubricant. The lubricating system can also have polyethylene glycol, wax, internally lubricated organo silane esters and mixtures thereof. The film forming polymer can be a polymer that results in a film less rigid than unplasticized polyvinyl acetate such as polyvinyl pyrrolidone, carboxylated styrene butadiene copolymer, starch, elastomeric polyurethanes and mixtures thereof. The aqueous chemical treating composition can also have one or more organo silane coupling agents in an effective coupling amount. The chemically treated glass fiber strands are most suitable for twisting while achieving a reduced tendency for filament breakage.

15 Claims, No Drawings

CHEMICALLY TREATED GLASS FIBERS

This application is a continuation of application Ser. No. 750,959, filed July 2, 1985, now abandoned.

The present invention is directed to chemically treated glass fibers, strands, bundles of strands, yarn, both twisted and untwisted and woven and nonwoven fabrics, where the fibers have a reduced tendency for breaks during processing.

Glass fibers used as twisted or untwisted strand and yarn for weaving must withstand the rigors of twisting and/or weaving without generating too many broken fibers or too much fuzz. Virgin glass fibers are brittle and would break if subjected to twisting and weaving. Once covered with a starch-oil chemical treating composition, the glass fibers are more pliable. These treated glass fibers have been twisted and woven with acceptable levels of fiber breakage and of fuzz generation.

In producing woven fabric from starch-oil treated glass fiber strands, the starch-oil residue on the fibers is removed by heat cleaning. This removal can reduce the original strength of the glass fibers and can result in ash being present on the heat-clean fabric. In electric circuit board applications, the ash content of the reinforcing fabric must be kept low to minimize any conductivity of the fabric.

It is an object of the present invention to provide chemically treated glass fibers having a reduced tendency for fiber breakage or fuzz generation upon twisting, weaving or further processing.

SUMMARY OF THE INVENTION

The foregoing object and other objects gleaned from the following disclosure are accomplished by the present invention. The chemically treated glass fibers of the present invention are glass fibers having a non-homogeneous, residue with a lubricious phase resulting from an aqueous chemical treating composition. The aqueous chemical treating composition has water and a lubricating system and a film forming polymer that forms a non-rigid film. The lubricating system which is present in at least about 30 weight percent of the solids of the aqueous chemical treating composition has one or more polyoxyalkylene polyols or polyalkylene polyols which have an effective high molecular weight and one or more cationic lubricants. In the lubricating system, the one or more polyols is present in an effective amount of the lubricating system to form the lubricious phase of non-homogeneous residue of the aqueous chemical treating composition. The non-rigid film is formed by film formers as polyvinyl pyrroidone, carboxylated sytrene butadiene copolymer, polyurethane polymers, and starch. The film forming polymer is present in an effective film forming amount. The water is present in an effective amount to enable the glass fibers to be treated with the aqueous chemical treating composition during formation of the fibers or at some latter point in the manufacture of glass fiber strands. The aqueous chemical treating composition can also have present one or more of the following components: one or more organo silane coupling agents, one or more lubricant modified organo silane coupling agents, one or more waxes, and one or more nonionic lubricants. When used, the wax and nonionic lubricant are part of the lubricating system. The chemically treated glass fibers can be dried at ambient conditions or dried at elevated temperatures for sufficient times to reduce the moisture content of and to form a non-homogeneous lubricious phase-containing residue from the aqueous chemical treating composition.

DETAILED DESCRIPTION OF THE INVENTION

Glass fibers of any fiberizable glass composition can be used with the present invention. For example, the "E-glass", "621-glass" and low or free boron and/or fluorine derivatives thereof can be used. The glass fibers can have the aqueous chemical treating composition applied to them by any method known to those skilled in the art. The time of application can be at any step in the manufacturing process of glass fiber strands, but, preferably, application occurs just after the fibers are formed from small orifices in a bushing from a direct melt or an indirect melt furnace. Also the aqueous chemical treating composition can be applied to the glass fibers at any subsequent point in the manufacturing process of the glass fibers. The lubricating system of the aqueous chemical treating composition has at least one or more polyalkylene polyols or polyoxyalkylene polyols with an effective molecular weight. The polyoxyalkylene and polyalkylene polyols are from a class of compounds known as polyether polyols. The water dispersible, polyoxyalkylene polyols with an effective molecular weight can be made by any suitable method known to those skilled in the art such as the base catalyzed reaction of alkylene oxide, such as methylene oxide, ethylene oxide, propylene oxide, butylene oxide, and the like with triols such as glycerol, trimethylolpropane and 1,2,6-hexantriol. Polyols having four or more hydroxyl groups have similarly been reacted with the alkylene oxide to prepare the oxyalkylated derivatives. The higher alkylene materials and high polyol materials such as pentaerythritol and sugar alcohols can be used, if any resulting solid material is properly emulsifiable with surfactants in water. This relates to the water dispersible nature of the polyoxyalkylene polyol. So the polyoxyalkylene polyol can be either a solid or a liquid as long as it is dispersible or emulsifiable or soluble in water. Preferably the polyol is a liquid to result in a liquid lubricious phase in the non-homogeneous residue of the aqueous chemical treating composition on the glass fibers. When the polyol is not a liquid, but rather an emulsified or dispersed solid, more moisture will have to be retained in the residue if a liquid lubricious phase is desired. Otherwise, a solid lubricious phase may be formed in the residue. The amount of one or more of these polyoxyalkylene polyols in in the range of about 0.5 to about 22.5 weight percent of the aqueous sizing composition. Nonexclusive examples of these polyether polyols include poly(oxypropylene) adducts of trimethylolpropane, poly(oxypropylene) adducts of glycerol; poly(oxypropylene-B-oxethylene) adducts of trimethylol propane and the like. The effective molecular weight of the polyol is that molecular weight that forms a non-homogeneous lubricious phase with non-rigid film forming polymers. Nonexclusive examples of a suitable average molecular weight range of these polyether polyols is generally about 300 to about 12,000 and preferably about 700 or more to around 10,000. Also a mixture of these Polyether polyols may be used like a blend of a 7000 average molecular weight, liquid polyalkylene polyol with a 10,000 average molecular weight, liquid polyoxyalkylene polyol. In this blend, the polyoxyalkylene polyol is a poly(oxypropylene) adduct of trimethylol propane. This blend can be present where the total amount of the polyol is in the range from about 40 to about 90 weight percent of the solids of the aqueous chemical treating composition. This blend can have any proportion of the two materials, but it is preferred to have a 50/50 blend. This blend can be prepared by combining the commercially available liquid polyalkylene polyol designated Pluracol ® V-7 polyol with the liquid polyoxyalkylene polyol designated Pluracol ® V-10 polyol both available from BASF-Wyandotte Corporation, Industrial Chemicals Group, Wyandotte, Mich.

The Pluracol ® V-7 polyol has the following properties:

| PLURACOL ® V-7 POLYOL TYPICAL PHYSICAL PROPERTIES | |
| --- | --- |
| Specific gravity, 25° C./25° C. | 1.090 |
| Flash Point, °F. | 510 |
| Fire Point, °F. | 580 |
| Pour Point, °F. | +25 |
| Ash, Typical, % | 0.2 |
| Specification (max.), % | 0.3 |
| Viscosity, as-is, at 210° F., SUS | 930 |
| cs | 200 |
| at 100° F., SUS | 5600 |
| cs | 1200 |
| Viscosity of Aqueous Solutions at 100° F. | |
| 20% Solution, SUS | 49 |
| cs | 7.0 |
| 50% Solution, SUS | 380 |
| cs | 81.4 |
| Inverse Cloud Point (2.5% °F./°C. 180/82 aqueous solution) | |
| Solubility | Pluracol ® V-7 is soluble in water, alcohols, and glycols. |

The Pluracol ® V-10 polyol which is preferably used in a blend with the Pluracol ® V-7 in the lubricating system has the following properties:

| PLURACOL ® V-10 POLYOL TYPICAL PHYSICAL PROPERTIES | |
| --- | --- |
| Appearance | Pale, yellow, clear viscous fluid |
| Viscosity at 210° F. | 6,000 cst (ASTM D445-53T) |
| at 100° F. | 45,000 cst (ASTM D445-53T) |
| Specific Gravity 60/60 °F. | 1,089 (BWC test) |
| Flash point | 510° F. (ASTM D92-52) |
| Fire point | 535° F. (ASTM D92-52) |
| Surface tension (1% aq.) | 54.7 dynes/cm at 75° F. (ASTM D1331-56) |
| | 48.4 dynes/cm at 105° F. (ASTM D1331-56) |
| | 44.2 dynes/cm at 110° F. (ASTM D-1331-56) |
| Shear Stability (in a typical fire resistant fluid) change in viscosity 12,000 cycles, 1000 psi | +1% (nod. VVL 791 method 3471) |

In addition to the polyether polyol with the effective molecular weight, the lubricating system has one or more cationic lubricants. The cationic lubricant acts as an external lubricant for the glass fibers and can be any cationic lubricant known to those skilled in the art of fiber glass sizing such as amidated polyamine lubricant or alkyl imidazoline reaction products of polyalkylene pentamines and stearic acid. Suitable examples of the partially amidated polyamines are the Emerylube materials that are partially amidated polyalkylene imines such as the reaction product of a mixture of $C_2$ to about $C_{18}$ fatty acids with a polyethylene imine having a molecular weight of about 1200. The reaction product has a residual amine value of from about 300 to 400. Also dilutions of this material may be used. Preferably the fatty acid amidating acid is the pelargonic acid. These materials are available from Emery Industries, Inc., Cincinnati, Ohio under the trade designations Emery 6717, and Emery 6760, a 50% active version of the 6717. An example of the alkyl imidazoline type cationic lubricant is the material available as Cation X lubricant.

In the lubricating system, the one or more polyether polyols with the effective molecular weight is present in an effective amount of the solids of the lubricating system. The effective amount is that amount taken in conjunction with the effective molecular weight which results in the formation of the non-homogeneous lubricious phase in the residue of the aqueous chemical treating composition on the glass fibers. Preferably, the amount of the polyol in the lubricating system is a predominant amount based on the solids of the lubricating system. When the lubricating system has both a polyoxyalkylene polyol and a polyalkylene polyol where the former has a molecular weight of around 10,000 and the latter has a molecular weight of around 7,000, the total amount of polyol present is in the range of about 40 to about 90 weight percent of the solids of the aqueous chemical treating composition. When the blend of polyoxyalkylene polyol and polyalkylene polyol is a 50/50 blend that is present, the blend is present in an amount from about 50 to about 90 weight percent of the solids of the aqueous chemical treating composition. The ratios of the polyether polyol to the cationic lubricant can vary so that if the amount of the polyether polyol is reduced, the amount of the cationic lubricant can be increased. The amount of the cationic lubricant in the lubricating system is usually a minor amount compared to the amount of polyol. Preferably, the amount of the cationic lubricant is in the range of around 2 to about 20 weight percent of the solids of the lubricating system, and in the range of about 1 to about 20 weight percent of the solids of the aqueous chemical treating composition. The amount of the lubricating system in the aqueous chemical treating composition should be at least about 30 weight percent of the solids of the composition to result in formation of the non-homogenous lubricious phase of the residue. Preferably, the amount of the lubricating system is a predominant amount of the solids of the aqueous chemical treating compositon and around 50 to about 95 weight percent of the solids.

In addition the polyether polyol and cationic lubricant, the lubricating system may also have present other components although they are not necessary but one or more are preferably present. Preferably, the lubricant system is essentially free of liquid petroleum and liquid vegetable oil. The additional components include: a polyethylene glycol such as the Carbowax material having a low molecular weight to make the material a liquid such as less than around 1,000, and wax such as microcrystalline waxes, and internally lubricating organo silane ester coupling agents.

The polyethylene glycol and wax can be any polyethylene glycol and wax known to those skilled in the art to be used in aqueous chemical treating compositions for glass fibers. The amount of the polyethylene glycol that is used can range from about the same amount as the cationic lubricant up to an amount of around one-half the amount of the polyether polyol based on the solids of the aqueous chemical treating composition. The amount of wax present in the lubricating system can generally range from an amount of a little less than the amount of the cationic lubricant to around twice as much as the cationic lubricant in the lubricating system based on the solids of the aqueous chemical treating composition. Preferably the polyethylene glycol and the wax are present in the lubricating system where the amount of the polyethylene glycol is slightly less than half the amount of the polyether polyol and the amount of the wax is present in an amount slightly less than to slightly greater than the amount of the cationic lubricant. A nonexclusive example of a suitable polyethylene glycol is Carbowax 300 available from Union Carbide Corporation.

Nonexclusive examples of wax emulsions which can be used include microcrystalline wax or paraffinic wax or a mixture thereof or any suitable wax emulsion used in conventional amounts. Suitable wax emulsions are available from Mobil Oil Company under the trade designation "Mobilcer waxes". These waxes generally have a melting point of higher than about 50° C. and the preferred melting point for the microcrystalline wax is above about 100° C. or more preferably about 135° C. When the paraffin wax is employed, its melting point should generally vary between 50° to about 80° C.

A nonexclusive example of the microcrystalline wax is the wax available from Mobil Chemical Company under the trade designation Mobilcer-Q wax or the material available under the trade designations Polymekon SPP-W.

When the internally lubricating organo silane ester coupling agent is present as the lubricant-modified organo silane coupling agent, the amount of the cationic lubricant present in the lubricating system can be reduced. The internal lubricating organo silane ester coupling agents functions as an internal lubricant. This material has a high molecular weight for silane coupling agents, where its viscosity is on the order of 3 to 6 times that of a silane coupling agent like gamma-aminopropyltriethoxy silane. The internal lubricant gives lubricity between the fibers and the strand. An example of a suitable internal lubricating silane coupling agent is that available from Union Carbide as an organo silane ester under their experimental designation Y-9662. This material can be used in the aqueous chemical treating composition as part of the lubricating system in an amount of up to around 2 weight percent of the solids of the aqueous chemical treating composition. Another or additional lubricating organo silane coupling agent is an internally lubricated gamma aminopropyltriethoxy silane, A-1108 coupling agent.

In addition to the lubricating system in the aqueous chemical treating composition, there is present one or more aqueous dispersible or emulsifiable film forming polymers which form non-rigid or non-brittle film. The film forming polymer produces a film that is too rigid if the film produced from the film forming polymer by itself is similar to a film produced by unplasticized polyvinyl acetate. For the film forming polymers that form a more continuous film, the amount of these materials preferably should be limited in the aqueous chemical treating composition to produce a less than continuous film. The film forming polymer provides integrity between the fibers in a bundle of fibers such as strand or yarn, but the film is not continuous to the extent that the lubricating system and the film forming polymer form a homogeneous phase on the glass surface. Nonexclusive examples of such film forming polymers include polyvinyl pyrrolidone, carboxylated styrene butadiene copolymers, elastomeric polyurethanes and starch. Any of the film forming polymers that are emulsifiable or dispersible in water are preferably pre-emulsified or pre-dispersed before adding to the aqueous chemical treating composition. The amount of the film forming polymer in the aqueous chemical treating composition is an effective film forming amount. This amount is that which provides an add-on on the glass fibers and enables at least a discontinuous coating of a moisture-reduced residue of the film forming polymer on the surfaces of the glass fibers. The film need not be vertically self-supported, but it should be at least a discontinuous, coating of a preceivable thickness.

By the term "a polyvinyl pyrrolidone" it is meant any homopolymer obtained by the addition polymerization of a monomer which may be represented by the formula:

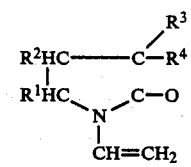

wherein $R^1$, $R^2$, $R^3$, $R^4$ may each be hydrogen or lower alkyls. Examples of such monomers include N-vinyl-2-pyrrolidone, 5-methyl-N-vinyl-2-pyrrolidone, 4-methyl-N-vinyl-2-pyrroldione, 5-ethyl-N-vinyl-2-pyrrolidone, 4-ethyl-N-vinyl-2-pyrrolidone, 3-methyl-N-vinyl-2-pyrrolidone, 3-ethyl-N-vinyl-2-pyrrolidone, 3,3-dimethyl-N-vinyl-2-pyrrolidone, 3,5-dimethyl-N-vinyl-2-pyrrolidone, and the like. These monomers and their homopolymerization products are known in the art. It is preferred that the polyvinyl pyrrolidone have an average molecular weight of from about 5,000 to 100,000, and it is most preferred that a K-30 polyvinyl pyrrolidone be used.

The carboxylated butadiene polymer or carboxylated butadiene styrene copolymer can have a bound styrene content of less than around 80 weight percent and can have an amount of carboxylation in the range of about 1 to 10 weight percent of the copolymer. The carboxylated styrene butadiene copolymer or carboxylated butadiene polymer can be produced through copolymerization or through graft polymerization techniques where the carboxyl group is grafted onto the polymer chain. The amount of bound styrene can be as high as around 85 weight percent of the polymer or copolymer. The amount of carboxylation can vary indirectly with the amount of the bound styrene. A suitable carboxylated styrene butadiene copolymer for use in the instant invention is the copolymer marketed by Arco Polymers, Inc. under the trade designation Dylex 55E. This material has a bound styrene of 60 percent, an amount of carboxylation in the range of about 1 to 5 weight percent of the copolymer and a total solids of 50 percent and a pH of 10 with an average viscosity of 90 centipoise and a surface tension of 30 dynes per centimeter. The carboxylated styrene butadiene copolymer can be any obtained by the monobasic or dibasic carboxylation agents such as acids or anhydrides.

Another example of a film forming polymer that can be used is starch and any starch or modified starch or mixtures of starches and modified starches can be used as are known by those skilled in the art to be useful in aqueous chemical treating compositions for glass fibers. Examples of suitable starches are those taught in U.S.

Pat. Nos. 3,227,192 and 3,265,516, both hereby incorporated by reference. The amount of the aqueous soluble, dispersible or emulsifiable film forming polymer can be in an amount of up to around 45 weight percent of the solids of the aqueous chemical treating composition.

Another suitable film forming polymer that can be used is one or more polyurethane polymers. By the use of the term polyurethane, it is meant to include reaction products of organic compounds having at least two active hydrogens and di and/or polyisocyanates, wherein the resulting polymer is an elastomeric curable polyurethane or polyurethane urea type polymer. By elastomeric, it is meant that the film of the polyurethane alone has a modulus at 100 percent elongation on the order of 200 to 2,000 psi. Preferably, the polyurethane has a hardness of about 10 Shore A to about 75 to 80 Shore D. The Shore hardness test is conducted on a Shore durometer by standard procedures, and elongation is measured in accordance with ASTM testing procedure, D412. Preferably, the organic compounds with at least two active hydrogens is a polyol such as a polyester polyol or polyether polyol and most preferably, a polyol which is linear. Examples of polyester-based polyurethane elastomers include those where the polyester is prepared from carboxylic acid such as adipic and the glycol portion can be selected from such materials as ethylene glycol, 1,2-propylene glycol, 1,3-butylene glycol and 1,4-butylene glycol. Further examples of polyfunctional polyesters which can be used are those based on phthalic anhydride, adipic acid, ethylene glycol, trimethylol propane, and the like. A slight amount of branching of the polyol can be tolerated but the degree of functionality or branching of the polyol should be kept to a minimum since increased branching results in films that are tougher, harder and less flexible. The di or polyisocyanates generally used to form the polyurethane are selected from aromatic, aliphatic and mixtures thereof, isocyanates but the aliphatic isocyanates are preferred. Examples of the polyisocyanates that can be used include the aromatic isocyanate of toluene diisocyanate and the aliphatic isocyanates such as hexamethylene diisocyanate, methylcyclohexylene diisocyanate, dicyclohexyl methane diisocyanate, lysine diisocyanate where the aromatic group is methyl or ethyl, bis(2-isocyanato ethyl) fumaric, bis(2-isocyanato ethyl) carbonate and dimeryl diisocyanate, where the organic group is essentially a $C_{36}$ hydrocarbon radical. Another isocyanate that may be used is 4,4'-diphenyl methane diisocyanate. The polyurethane polymer can be made as an uncurable or as a curable material by any method known to those skilled in the art, for instance, additional monomers like diisocyanate, polyols or epoxies can be added to the polymer and/or a curable moiety can be introduced into the polymer. The polyurethane polymers can be produced by any one-shot or single step method known to those skilled in the art or by the two step chain extension process utilizing linear or lightly branched polyols with the necessary molar portions of a diisocyanate known to those skilled in the art to produce a water dispersible polyurethane. One or more of a mixture of these various elastomeric curable polyurethanes can be used in the aqueous coating composition of the present invention. Particularly, two or more of the polyurethanes can be blended to achieve a desired hardness and/or elongation property for the coating on the sized glass fibers. These elastomeric curable polyurethanes are water soluble, emulsifiable or dispersible through the use of dispersing agents and emulsifiers which can have a nonionic, cationic and/or anionic and/or amphoteric or zwitterionic nature. In addition, the polyurethane polymers can be internally emulsified by incorporating one or more dispersing agents or emulsifiers with the other polyurethane producing monomers to produce the polyurethane polymer. Any curable polyurethane should have a curability through crosslinking of not too much more than around 10 percent or less based on the solids of residue of the aqueous chemical treating composition or on a dry basis.

Specific examples of commercially available polyurethane polymers that can be used include a blend of polyester based polyurethane dispersions such as Witcobond W-290-H, available from Witco Chemical Corporation and XW-110 dispersion available from Mobay Chemical Corporation. The XW-110 material is a fully reacted polyurethane dispersed in water/N-methyl-2-pyrrolidone and contains no free isocyanates. The dispersion has a hazy off-white appearance with a 35 percent solids level and a density of 8.7 lb/gal. The viscosity at 25° C. (77° F.) in cps is 130, and the surface tension in dynes/cm is 41. The film properties include: clear appearance, 6,600 psi tensile strength, 170% elongation at break, 5200 psi at 100% elongation and 5700 psi yield modllus. The Witcobond W-290-H polyurethane has a milky white appearance, is aliphatic in type with a 65 percent solids level with an anionic charge and with a particle size of around 2 micrometers and with a pH at 25° C. (77° F.) of 7.5 and with a viscosity as measured by Brookfield LVF in cps of 200 and with a surface tension of 42 dynes/cm. The film properties of the 290H material are: 4500 psi tensile strength, 720 percent elongation and moduli of 250 psi at 100%, 540 psi at 300% and 1550 psi at 500%. The blend of these dispersions can be in any ratio to give a modulus in the desired range. Preferably the blend is a 1:3 blend of the XW 110 material to the 290H material.

In addition to the lubricating system and film forming polymer, the aqueous chemical treating composition can also have one or more organo coupling agents. The presence of these materials is especially useful for glass fiber yarn to be coated for screening applications. Examples of the organo coupling agents which can be used include vinyl-functional organo silane coupling agents like gamma methacryloxy propyltrimethoxy silane available from Union Carbide Corporation under the trade designation A-174. Another example is silylated polyazamides which are available from Union Carbide Corporation under the trade designation Y-5987. This material has a boiling point at 760 millimeters mercury of 64.5° C. (methanol) a specific gravity of 0.97 at 25/25° C., a vapor pressure at 20° C. of approximately 95 millimeters of mercury, a freezing point of less than 0° C. and 20 percent dispersibility in water and is a 50/50 mix of the silylated polyazamide and methanol. Examples of two other organofunctional silanes that can be present are an epoxy organofunctional silane like gamma-glycidoxypropyltrimethoxysilane and ureido functional silane such as

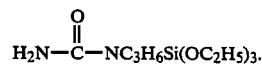

The silanes can be present in their unhydrolyzed, hydrolyze or partially hydrolyzed forms. The amount of the organo silane coupling agent that is used can be any amount typically used by those skilled in the art in aqueous chemical treating compositions for treating glass fibers.

Other components ordinarily used in minor amounts in aqueous chemical treating compositions for treating glass fibers can also be used in the present invention. The exception is those components that have been specifically excluded such as in the preferred embodiment where the aqueous chemical treating composition is essentially free of the liquid petroleum oils and liquid vegetable oils.

The amount of water in the aqueous chemical treating composition is that amount to give a total solids (nonaqueous content) of the aqueous chemical treating composition sufficient to treat glass fibers. Traditionally, the aqueous chemical treating composition should have an amount of water to give a solids content so that the viscosity of the solution of the aqueous chemical treating composition is not greater than 100 centipoise at 20° C. Solutions having greater viscosities are difficult to apply to the glass fibers during their formation with standard type applicator equipment without breaking the continuity of the fibers. The aqueous chemical treating composition can have a solids content in the range of about 1 to about 25 weight percent, preferably from about 3 to about 10 weight percent. It is also preferred that the viscosity of the aqueous chemical treating composition is between about 1 and 20 centipoise at 20° C. for best results. Other means of applying the aqueous chemical treating composition can be used so that thixotropic agents can be utilized for thixotropic sizes. The aqueous chemical treating composition can be prepared by adding any of the components simultaneously or sequentially to each other to form an aqueous chemical treating composition for treating glass fibers. It is preferred to predilute most of the components that are not very soluble in water. For example, the polyether polyol, cationic lubricant, film forming polymer, polyethylene glycol and wax and silane coupling agents are all prediluted. The aqueous chemical treating composition is applied to the glass fibers in such a manner to give a moisture-reduced residue on a bundle of glass fibers to achieve a loss on ignition (LOI) in the range of about 1 to about 3 weight percent. The chemically treated glass fiber strands are dried at ambient temperature or elevated temperatures in an oven by any process known to those skilled in the art to remove a substantial amount of the moisture from the strands or bundles. The strands of the glass fibers having the moisture-reduced residue of the aqueous chemical treating composition can be twisted to produce yarn or can be used in an untwisted state. Any method of twisting glass fiber strands to produce yarn can be used with the present invention.

The surface of the strands or bundles of the chemically treated glass fibers after drying has a non-homogeneous, lubricious phase-containing, moisture-reduced residue of the aqueous chemical treating composition on the glass surface. In this residue, the lubricating system usually is present as a single liquid phase either on the surface of the film forming polymer or under and through the surface of the film of the film forming polymer on the glass surface.

PREFERRED EMBODIMENT OF THE INVENTION

The glass compositions of either "E-glass" or "621-glass" are treated with the aqueous chemical treating composition in a direct melt glass fiber manufacturing process. The aqueous chemical treating composition is applied to the glass fibers as they are attenuated from the orifices in a bushing by a contact type applicator like a belt-type applicator.

The aqueous chemical treating composition preferably has the lubricating system comprising a 50/50 blend of the polyoxyalkylene polyol Pluracol ® V-10 and the polyalkylene polyol, Pluracol ® V-7 along with the cationic lubricant which is a partially amidated polyamine lubricant along with the polyethylene glycol having a molecular weight of about 300 and the internally lubricated organo silane ester coupling agent, Y-9662 and an additional internally lubricated amino silane organo coupling agent, A-1108. Preferably, the film forming polymer is a carboxylated styrene butadiene copolymer having an amount of bound styrene of 61 percent.

The aqueous chemical treating composition is preferably prepared by adding warm deionized water in an amount of about 10 times the amount of polyols to be used to a main mix tank and adding each polyol until dissolved. Deionized water at a temperature of about 120° F. (49° C.) is added to a separate mix tank where the amount of water is about 20 times the amount of the cationic lubricant to be used. The amount of the cationic lubricant is added to the hot water and agitated until dissolved and transferred to the main mix tank. Cold water in an amount of about 50 times the amount of carboxylated styrene butadiene to be used is added to a separate mix tank. The carboxylated styrene butadiene copolymer is added to the water in the mix tank and agitated until dissolved and then transferred to the main mix tank. Cold water in an amount of around 13 times the amount of polyethylene glycol to be used is added to a separate mix tank and the polyethylene glycol is added to the water with agitation until dissolved and transferred to the main mix tank. Cold deionized water in an amount of a little greater than twice the amount of total silanes to be used is added to a separate mix tank and the two silane coupling agents are added sequentially with agitation for 5 to 15 minutes and then the silane coupling agents are added to the main mix tank. The binder can be used at room temperature and this is also true for the binder having the starch used as the film former since the size is essentially free of petroleum oil.

The aqueous chemical treating composition contacts the glass fibers and the treated glass fibers are gathered into G-150 glass fiber strands, like G-50 or G-75 strands, although any filament diameter can be used for the glass fibers and any number of glass fibers can be combined to produce the strand. The chemically treated glass fiber strands are air dried on forming packages and twisted to produce twisted yarn on standard textile twisting frames.

The twisted or untwisted glass fiber strands can be used in producing various fabrics both woven and nonwoven.

Table 1 presents 21 examples of aqueous chemical treating compositions that can be used in the present invention. The aqueous chemical treating compositions are prepared by the predilution method similar to that of the preferred embodiment. When different film forming polymers are used in the examples, they are prediluted in a manner similar to that for the carboxy styrene butadiene copolymer of the preferred embodiment. The polyurethane film forming polymers are blended in Example 17 by adding both dispersions to a mix tank and diluting, the diluted polyurethanes are transferred to a main mix tank and the polyalkylene polyol V-7 is added directly to the main mix tank as is the silylated polyazamide. The other components are added after predilution. In example 18, the polyurethane is prediluted and is added to the blend of diluted polyols and all the other components are prediluted and added to the main mix tank.

TABLE 1

| COMPONENTS | 1 Gms/Wt % Solids | 2 Gms/Wt % Solids | 3 Gms/Wt % Solids | 4 Gms/Wt % Solids |
|---|---|---|---|---|
| (A) Lubricating System: | | | | |
| Polyoxyalkylene polyol Pluracol ® V-10 polyol | 3000/26.3 | 3000/27 | 3000/27 | 3000/28.2 |
| Polyalkylene polyol Pluracol ® V-7 polyol | 3000/26.3 | 3000/27 | 3000/27 | 3000/28.2 |
| Internally lubricated organo-silane ester coupling agent | 150/1.3 | 150/1.3 | 100/.9 | 150/1.4 |
| Polyaminoamide external lubricant Emery 6760 50% Solids or Active | 2000/8.8 | 1500/6.7 | 1500/6.7 | 1500/7 |
| Polyethylene glycol (Carbowax) | 2000/17.5 | 2000/17.9 | 2000/18 | 2000/18.8 |
| Wax Mobilcer Q | 1500/13.2 | 1500/13.4 | 1500/13.5 | — |
| Polymekon SPP-W | — | — | — | 1000/9.4 |
| (B) Film Forming Polymers: | | | | |
| Polyvinylpyrrolidone | — | — | — | — |
| Carboxylated styrene butadiene emulsion 50% Solids | 1500/1.3 | 1500/6.7 | 1500/6.7 | 1500/7 |
| Water to Make Stated Volume | 50 | 50 | 50 | 50 |

| COMPONENTS | 5 Gms/Wt % Solids | 6 Gms/Wt % Solids | 7 Gms/Wt % Solids | 8 Gms/Wt % Solids |
|---|---|---|---|---|
| (A) Lubricating system: | | | | |
| Polyoxyalkylene polyol Pluracol ® V-10 polyol | 3000/29.6 | 3000/31.1 | 3000/30.3 | 3000/31.9 |
| Polyalkylene polyol Pluracol ® V-7 polyol | 3000/29.6 | 3000/31.1 | 3000/30.3 | 3000/31.9 |
| Internally lubricated organo-silane ester coupling agent | 150/1.5 | 150/1.6 | 100/1.5 | 150/1.6 |
| Polyaminoamide external lubricant Emery 6760 50% Solids or Active | 1500/7.3 | 1500/7.8 | 1500/7.5 | 1000/5.3 |
| Polyethylene glycol (Carbowax) | 2000/19.7 | 2000/20.7 | 2000/20.2 | 2000/21.3 |
| Wax Mobilcer Q | — | — | — | — |
| Polymekon SPP-W | 500/4.9 | — | 500/5.0 | 500/5.3 |
| (B) Film Former: | | | | |
| Polyvinylpyrrolidone | — | — | — | — |
| Carboxylated styrene butadiene emulsion 50% Solids | 1500/7.3 | 1500/7.8 | 1500/5.0 | 500/2.7 |
| Water to Make Stated Volume | 50 | 50 | 50 | 50 |

| COMPONENTS | 9 Gms/Wt % Solids | 10 Gms/Wt % Solids | 11 Gms/Wt % Solids |
|---|---|---|---|
| (A) Lubricating system: | | | |
| Polyoxyalkylene polyol Pluracol ® V-10 polyol | — | 600/23.6 | 3795/22 |
| Water | — | — | 65000 |
| Polyalkylene polyol Pluracol ® V-7 polyol | 1200/48.1 | 600/23.6 | 3795/22 |
| Internally lubricated organo-silane ester coupling agent | 30/1.2 | 30/1.2 | — |
| Polyaminoamide external lubricant Emery 6760 50% Solids or Active | 200/4 | 300/5.9 | 3795/11.1 |
| Water | — | — | 34500 |
| Polyethylene glycol (Carbowax 300) | 400/16 | 400/15.7 | 2208/12.9 |
| Wax Mobilcer Q | — | — | 2000/11.7 |
| Polymekon SPP-W | — | — | — |
| (B) Film Former: | | | |
| Polyvinylpyrrolidone | 750/30.1 | 750/29.5 | 3450/20 |
| Water | — | — | 34500 |
| Carboxylated styrene butadiene emulsion 50% Solids | — | — | — |
| Water | — | — | 34600 |
| Vinyl functional silane (A-174) | 12.5/0.5 | 12.5/0.5 | — |
| Water to Make Stated Volume | 10 | 10 | 50 |

| COMPONENTS | 12 Gms/Wt % Solids | 13 Gms/Wt % Solids | 14 Gms/Wt % Solids | 15 Gms/Wt % Solids | 16 Gms/Wt % Solids |
|---|---|---|---|---|---|
| (A) Lubricating System: | | | | | |
| Polyoxyalkylene polyol Pluracol ® V-10 polyol | 3795/23.8 | 3795/23.8 | 3795/26.1 | 956/ | 3795 |
| Water | 65000 | 65000 | 65000 | — | 65000 |
| Polyalkylene polyol Pluracol ® V-7 polyol | 3795/23.8 | 3795/23.8 | 3795/26.1 | 956/ | 3795 |
| Internally lubricated organo- | 190/1.2 (Y-9665) | 190/1.2 (9662) | — | 120/ | (49662) 190 |

TABLE 1-continued

| silane ester coupling agent | | | | | |
|---|---|---|---|---|---|
| Polyaminoamide external lubricant Emery 6760 50% Solids or Active | 1000/3.1 | 1000/3.1 | 3795/13 | 956/ | 1000/ |
| Water | 34500 | 34500 | 34500 | — | 34000 |
| Polyethylene glycol (Carbowax 300) | 2208/13.8 | 2208/13.8 | 2208/15.2 | 850/ | 2208/ |
| Wax Mobilcer Q | 2000/12.5 | 2000/12.5 | — | — | 2000/ |
| Polymekon SPP-W | — | — | 2000/13.7 | — | — |
| (B) Film Former: | | | | | |
| Polyvinylpyrrolidone | 3450/21.6 | 3450/21.6 | — | — | 3450/ |
| Water | — | — | 34500 | — | 34000/ |
| Starch 1554/213 blend | — | — | — | 5860/1000/ | — |
| Carboxylated styrene butadiene emulsion 50% Solids (Dylex K-55E) | — | — | 1725 (862.5)/5.9 | — | 3450/ |
| Water | 30500 | 30500 | 34000 | — | 34000/ |
| Vinyl functional silane (A-174) | — | — | — | — | — |
| Water to Make Stated Total Volume | 50 | 50 | 50 | 40 | 50 |

| COMPONENTS | 17 Gms/Wt % Solids | 18 Gms/Wt % Solids | 19 Gms/Wt % Solids |
|---|---|---|---|
| (A) Lubricating System: | | | |
| Polyoxyalkylene polyol Pluracol ® V-10 polyol | 1200/26.4 | — | 2360/33.9 |
| Water | — | — | 35400 |
| Polyalkylene polyol Pluracol ® V-7 polyol | 1200/26.4 | 2800/59 | 2360/33.9 |
| Internally lubricated organo-silane ester coupling agent | 60/1.3 | 100/2.1 | — |
| Polyaminoamide external lubricant Emery 6760 50% Solids or Active | 1000/11 | 338.8/3.6 | 1180/8.5 |
| Water | — | — | 11800 |
| Polyethylene glycol (Carbowax 300) | 800/17.6 | 600/12.6 | 472/6.8 |
| Water | — | — | 11800 |
| Wax Mobilcer Q | — | — | — |
| Polymekon SPP-W | 100/2.2 | — | — |
| (B) Film Former: | | | |
| Polyvinylpyrrolidone | — | — | 1180/17 |
| Water | — | — | 23600 |
| Carboxylated styrene butadiene emulsion 50% Solids | — | — | — |
| Polyurethane high modulus XW-110 | 394/3 | 600/4.4 | — |
| Polyurethane low modulus 290H | 656/9.3 | 1000/13.7 | — |
| Vinyl functional silane (A-174) | — | — | — |
| Silylated polyazamide (Y-5987) | 120/2.6 | — | — |
| Epoxy silane A-187 | — | 113.6/1.7 | — |
| Ureido-functional silane A-1160 | — | 198.8/2.9 | — |
| Water to Make Stated Total Volume | 20 | 10 | 8 |

| COMPONENTS | 20 Gms/Wt % Solids | 21 Gms/Wt % Solids |
|---|---|---|
| (A) Lubricating System: | | |
| Polyoxyalkylene polyol Pluracol ® V-10 polyol | 3000/30.9 | 3000/29.8 |
| Water | 65000 | 65000 |
| Polyalkylene polyol Pluracol ® V-7 polyol | 3000/30.9 | 3000/29.8 |
| Internally lubricated organo-silane ester coupling agent | 150/1.5 | 150/1.5 |
| Polyaminoamide external lubricant Emery 6760 50% Solids or Active | 1500/7.7 | 2250/11.2 |
| Water | 34500 | 34500 |
| Polyethylene glycol (Carbowax 300) | 2000/20.6 | 2000/19.8 |
| Wax Mobilcer Q | — | — |
| Polymekon SPP-W | — | — |
| (B) Film Former: | | |
| Polyvinylpyrrolidone | — | — |
| Water | 34500 | 34500 |
| Carboxylated styrene butadiene emulsion 50% Solids | 1500/7.7 | 1500/7.4 |
| Water | — | — |
| Vinyl functional silane (A-174) | 62.5/0.5 | 62.5/0.5 |
| Water to Make Stated Total Volume | 50 | 50 |

Nine aqueous chemical treating compositions of Table 1 were used in producing twisted G-75 glass fiber strand yarn. These glass fiber strand yarns were tested for tensile strength, quill count, broken filaments, and fuzz balls. Similarly, commercially available starch-oil sized, G-75 twisted glass fiber strand yarn available from PPG Industries, Inc. was tested in these various tests. The results of the testing is given in Table 2.

TABLE 2

Performance Results of Strands of Glass Fibers Treated with Some of the Compositions of Table 1

| Treated Glass Fiber Yarn Having Dried Residue of Example ( ) From Table 1 | Yd/lb (Cov) | Tensile Tensile Strength (lb) | Quill Count 1st/2nd | Outside Broken Filaments 1st/2nd | Fuzz Balls/Million Ends Yarn 1st/2nd |
|---|---|---|---|---|---|
| Example 1 | 7449 | 9.1 | 1.8 | 4.6 | 0/0 |
| Example 2 | 7412 | 9.8 | 1.1 | 4.5/3.9 | 2.9/1.7 |
| Example 3 | 7439 | 9.3 | 5.6 | 8.9/3.9 | 0/20 |
| Example 4 | 7595 | 9.4 | 0.3 | 4.5/0.9 | 1.6/3.4 |
| Example 5 | 7298 | 9.8 | 3.7 | 3.1/2.7 | 3.1/0 |
| Example 6 | 7482 | 9.0 | 6.0 | 3.6/2.0 | 0/3 |
| Example 7 | 7196 | 10.2 | 0.5 | 4.5/1.9 | 1.5/0 |
| Example 8 | — | — | 4.9/2.5 | 5.8/2.2 | 0/2 |
| Example 8 | — | — | — | — | 0/0 |
| Example 8 | — | — | 2.7 | 2.9 | 13 |
| Example 15 | 7391 | 9.47 | 4.9/2.7 | 2.7/2.5 | 2.8/0 |
| Commercial Yarn | — | 7.3 | 19/17 | — | 8/38 |

In Table 2 the tensile strength test was performed according to standard ASTM method. The quill count test was performed by winding the yarn on a spool which is 8 inches in length and 5/16 of an inch in diameter and after winding is completed the number of broken filaments on the surface of the quill is counted. The number of broken filaments is then recorded. The numbers with decimal points arise from an average of several quill counts. The broken filament test was conducted by visually measuring broken filaments around the circumference of 10 bobbins and by taking the average value per bobbin. With two test values, the test was conducted on two sets of 10 bobbins. The fuzz ball per million ends of yarn test with two measurement events was accomplished in the following manner. The method involves placing twisted glass fiber strands from packages through tensioning devices to simulate warping. Any fuzz on the strands usually builds up at the tensioning devices or the comb until the fuzz breaks away as a fuzzball. These fuzzballs are counted both visually and photometrically to give the number of fuzzballs per million ends per yard of the strands. The lower numbers indicate fewer fuzzballs generated and this is indicative of good quality glass fiber yarn.

In comparing the examples 1–8 and 15 with the commercial yarn sample, the improvement in quill count and fuzz balls is apparent. Also an improvement in tensile strength can be achieved.

Table 3 presents yarn quality performance results for five experimental samples of yarn each treated with the listed treating composition of Table 1 versus a commercial yarn sample. The commercial yarn sample is a starch oil glass fiber yarn available from PPG Industries, Inc. All of the yarn was of the G-150 construction for the experimental samples and the commercial yarn samples. The tests were conducted in a similar manner for the experimental samples and the commercial sample for number of broken filaments per plane, breaks per pounds, breaks per bobbin, and for the experimental samples the total weight tested and the weight of waste are also given in Table 3.

The number of broken filaments per plane was determined in the following manner. The number of broken filaments per plane involved visually determining the number of broken filaments at one point or plane of the circumference of 20 bobbins and averaging the values for the 20 bobbins. The determination was made three times, at the start, middle and end of the removal of the yarn from the bobbins.

The number of broken filaments were calculated on a breaks per pound basis and a breaks per bobbin basis in processing the yarn through a die coater.

TABLE 3

Yarn Quality Performance Results

| Examples | No. of Broken Filaments Per Plane Start | Middle | End | Breaks Per lb. | Breaks Per Bobbin | Total Weight Tested (lb.) | Weight of Waste (lb.) |
|---|---|---|---|---|---|---|---|
| Example 8 | 0 | 0 | 0 | 0 | 0 | 122.33 | 0 |
| Example 20 | 0 | 0 | 0 | 0 | 0 | 116.65 | 0 |
| Example 21 | 0 | 0 | 0 | 0 | 0 | 112.20 | 0 |
| Example 9 | 0 | 0 | 0 | 0 | 0 | 121.44 | 0 |
| Example 10 | 0 | 0 | 0 | 0 | 0 | 119.65 | 0 |
| Commercial Starch Binder Yarn | | | | 0.03 (nominal) | | | |

From Table 3, it can be determined that the yarn quality for the yarn having the experimental glass fibers treated with the aqueous chemical treating composition performed well compared to the commercial yarn in breaks per pound and the table shows that the number of broken filaments per plane was excellent.

In Table 4, the cleanability of the strands of the chemically treated glass fibers is shown for both water washing and heat cleaning. For the water washing of the glass fiber strand yarn, G-75 yarn with the indicated binder of Table 1 was woven on a 4-inch needle loom. The construction of these fabrics was 44/52. In the fill direction, the yarn runs on a double pick which is characteristic of this particular loom. However, the air permeability of the fabrics was similar to a fabric having a 44×32 construction. For continuous aqueous washing, the fabrics were immersed in 75° F. or 155° F. water for five seconds, and the fabrics were subsequently squeezed through a textile paddler at 25 psi. The same sequence was repeated a second time. The fabrics were dried at 200° F. for 3 minutes. For batch cleaning, the operation involved extracting fabrics for two hours at 155° F. (4 cycles) in a Soxhlette, and the fabrics were dried at 200° F. for 3 minutes. The residual binder was determined from the original LOI. For heat cleaning, the fabrics were ashed at 1200° F. for 2 hours and the percent ash was determined. Also the conductivity in micromoh was determined from slurring the ash in 200 millimeters of deionized water.

TABLE 4

| Chemically Treated Glass Fibers | Cleanability of Strands of Chemically Treated Glass Fibers ||||| Heat Cleaning Conductivity of Ashed Samples ||
|---|---|---|---|---|---|---|---|
| | Water Washing |||||||
| | Original | Continuous 10 sec. wash || Batch 2 hr. wash | | | |
| | LOI % | Cold % | Hot % | Hot % | % Removed | % Ash | Conductivity in Micromoh |
| Commercial Starch-oil yarn | | Heat Cleaned Only |||| 0.3556 | 42.6 |
| Yarn of Glass Fibers Treated with Eg. 21 of Table 1 | 1.14 | .53 | .26 | .22 | 80 | 0 | 6.2 |

Table 4 shows that for aqueous cleaning of yarn of glass fibers of the present invention, extremely gentle scouring at 155° F. for 10 seconds can remove 80 percent of the binder with the water-soluble components and 40 percent of the partially soluble binder. The heat cleaning results show better heat cleanability with reduced ash content than the commercial starch oil yarn.

I claim:

1. Glass fibers having a non-homogeneous, moisture-reduced residue, where the residue results from an aqueous chemical treating composition, consisting essentially of:
   a. a lubricating system in a predominant amount of the solids of the aqueous chemical treating composition, having:
      1. one or more polyols selected from the group of a polyoxyalkylene polyol and a polyalkylene polyol with effective high molecular weights wherein the blend is present in a predominant amount of the solids of the lubricating system to form a lubricious phase,
      2. one or more cationic lubricants,
      3. one or more external nonionic lubricants,
      4. one or more lubricant-modified organo silane coupling agents,
   b. an aqueous soluble, dispersible, emulsifiable film forming polymer that produces a non-rigid film and that is present in an effective film forming amount,
   c. water in an amount to give a viscosity for the chemical treating composition to treat the glass fibers.

2. Glass fiber strands of claim 1, wherein the blend of the polyoxyalkylene polyol and polyalkylene polyol is a 50:50 blend that is present in an amount from about 50 to about 90 weight percent of the solids of the aqueous chemical treating composition.

3. Glass fiber strands of claim 1, wherein the cationic lubricant is selected from the group consisting of alkyl imidazoline reaction products of a alkylene polyamine and a fatty acid, and of partially amidated fatty acid amine or polyalkyleneimines present in an amount from about 1 to about 13 weight percent of the solids of the aqueous chemical treating composition.

4. Glass fiber strands of claim 1, wherein the external nonionic lubricant is selected from polyethylene glycol, wax and mixtures thereof present in an amount of around half the amount of the blend of polyoxyalkylene polyol and polyalkylene polyol.

5. Glass fiber strands of claim 1, wherein the lubricant-modified organo silane coupling agent is selected from internally lubricated organo silane esters, and internally lubricated organo silane coupling agents.

6. Glass fibers of claim, 1 wherein the aqueous chemical treating composition has present an organo silane coupling agent selected from vinyl-containing organo silane coupling agents and amino containing organo silane coupling agents, glycidoxy-containing organo silane coupling agent, and ureido functional organo silane coupling agents and mixtures of two or more of these coupling agents.

7. Glass fiber strands of claim 1, wherein the film forming polymer is selected from the group consisting of polyvinyl pyrrolidone, carboxylated styrene butadiene copolymer, starch, and one or more polyurethane polymers having a film elongation at 100 percent in the range from about 200 to 2000% or combinations of any two or more of these.

8. Glass fibers of claim 1 that are twisted.

9. Glass fiber strands having a moisture-reduced, non-homogeneous residue with a lubricious phase where the residue results from an aqueous chemical treating composition, consisting essentially of:
   a. a lubricating system present in an amount from about 50 to about 95 weight percent of the solids of the aqueous chemicl treating composition having:
      1. a blend of polyoxyalkylene polyol and polyalkylene polyol, wherein the former has a molecular weight of around 10,000 and the latter has a molecular weight of around 7,000 present in a 50/50 blend and present in the predominant amount of the solids of the lubricating system,
      2. a cationic lubricant selected from the group consisting of alkyl imidazoline reaction products of an alkylene polyamine and a fatty acid amine, and of partially amidated fatty acid amine or polyalkyleneimines present in an amount from about 1 to about 13 weight percent of the solids of the aqueous chemical treating composition,
      3. polyethylene glycol having a molecular weight from about 100 to about 500 present in an amount of about half the solids of the blend of polyoxyalkylene polyol and polyalkylene polyol,
      4. wax present in an amount of about a fifth to about the same amount of the polyethylene glycol,
      5. one or more lubricating organo silane coupling agents selected from internally lubricated organo silane esters having a viscosity of about 3 times the viscosity of gamma aminopropyltriethoxy silane and an internally lubricated gamma aminopropyltriethoxy silane in an amount of about 0.1 to about 2 weight percent of the solids of the aqueous chemical treating composition,
   b. aqueous soluble, dispersible or emulsifiable film forming polymer that produces a non-rigid, film selected from the group consisting of: polyvinyl pyrrolidone, carboxylated styrene butadiene copolymers, starch, and a blend of polyurethane polymers that gives a film elongation percent in the range of about 200 to about 2000, and that is present in an amount in the range of about 1 to about 15 weight percent of the solids of the aqueous chemical treating composition,
c. one or more organo silane coupling agents present in an amount of about 0 to about 2 weight percent of the solids of the aqueous chemical treating composition,
d. water in an amount to give a solids content for the aqueous chemical treating composition within the range of about 1 to about 20 weight percent.

10. Glass fiber strands of claim 9 that are twisted.

11. Glass fiber strands of claim 9, wherein the cationic lubricant is a partially amidated polyalkyleneimine that is the reation product of a pelargonic acid amidating agent and polyalkyleneimine.

12. Glass fibers of claim 1, wherein the film forming polymer produces a non-rigid film by itself that is less rigid than a film of unplasticized poly(vinyl acetate), and results in a dried residue that is less than continuous film of a homogeneous phase on the glass surface when present with the lubricating system in the aqueous chemical treating composition.

13. Glass fiber strands of claim 9, wherein the film forming polymer produces a non-rigid film by itself that is less rigid than a film of unplasticized poly(vinyl acetate), and results in a dried residue that is less than a continuous film of a homogeneous phase on the glass surface when present with the lubricating system in the aqueous chemical treating composition.

14. Glass fibers of claim 1, wherein the film forming polymer is present in an amount up to around 45 weight percent of the solids of the aqueous chemical treating composition.

15. Glass fibers having a non-homogeneous, moisture-reduced residue with a lubricious phase, where the residue results from an aqueous chemical treating composition, consisting essentially of
a. at least about 30 weight percent of the solids of the composition is a lubricating system having:
 1. one or more polyols selected from the group consisting of polyoxyalkylene polyols and polyalkylene polyols with an effective high molecular weight and mixtures thereof, where the polyol is in an effective lubricious phase-forming amount of the lubricating system,
 2. one or more cationic lubricants, and
b. an aqueous soluble, dispersible or emulsifiable film forming polymer that produces a non-rigid film selected from the group consisting of poly(vinyl pyrrolidone) and carboxylated styrene butadiene and mixtures thereof and mixtures of at least one of these with a film forming polymer selected from elastomeric polyurethanes and starch and mixtures thereof that is present in an effective film forming amount, and
c. water in an amount sufficient to treat the glass fibers with the aqueous chemical treating composition.

* * * * *

UNITED STATES PATENT AND TRADEMARK OFFICE
CERTIFICATE OF CORRECTION

PATENT NO.   :   4,795,678
DATED        :   January 3, 1989
INVENTOR(S)  :   Mikhail M. Girgis It is certified that error appears in the above-identified patent and that said Letters Patent is hereby corrected as shown below:

Column 18, claim 9, line 34, "chemicl" should be

--chemical--.

Signed and Sealed this

Second Day of April, 1991

*Attest:*

HARRY F. MANBECK, JR.

*Attesting Officer*   *Commissioner of Patents and Trademarks*